United States Patent

Dove et al.

[11] Patent Number: 6,088,414
[45] Date of Patent: Jul. 11, 2000

[54] METHOD OF FREQUENCY AND PHASE LOCKING IN A PLURALITY OF TEMPORAL FRAMES

[75] Inventors: Jason W. Dove, Novato; John Witchey, Larkspur, both of Calif.

[73] Assignee: Alcatel USA Sourcing, L.P., Plano, Tex.

[21] Appl. No.: 08/993,288

[22] Filed: Dec. 18, 1997

[51] Int. Cl.[7] .............................. H03D 3/24; H04L 7/06
[52] U.S. Cl. .......................................... 375/376; 375/373
[58] Field of Search ..................................... 375/354, 368, 375/371, 373, 375, 376; 327/147, 156

[56] References Cited

U.S. PATENT DOCUMENTS

| | | | |
|---|---|---|---|
| 4,042,783 | 8/1977 | Gindi | 370/453 |
| 4,996,698 | 2/1991 | Nelson | 375/118 |
| 5,015,970 | 5/1991 | Williams et al. | 331/11 |
| 5,123,008 | 6/1992 | Beesley | 370/29 |
| 5,144,669 | 9/1992 | Faulkner et al. | 380/49 |
| 5,353,313 | 10/1994 | Honea | 375/118 |
| 5,396,492 | 3/1995 | Lien | 370/60 |
| 5,459,607 | 10/1995 | Fellows et al. | 359/138 |
| 5,623,311 | 4/1997 | Phillips et al. | 348/396 |
| 5,634,041 | 5/1997 | Pratt et al. | 395/553 |
| 5,657,344 | 8/1997 | Na | 375/219 |
| 5,742,208 | 4/1998 | Blazo | 331/23 |
| 5,901,180 | 5/1999 | Aslanis et al. | 375/261 |

Primary Examiner—Young T. Tse
Attorney, Agent, or Firm—Fliesler, Dubb, Meyer & Lovejoy

[57] ABSTRACT

A frequency and phase locking method for fine phase locking of a plurality of temporal frames, such as synchronous optical network (SONET) frames, includes the steps of fine phase tracking of the first frame and setting the phases of the subsequent frames in coherence with the phase of the first frame, for example, by a plurality of drop clock signals.

79 Claims, 5 Drawing Sheets

METHOD OF FREQUENCY AND PHASE LOCKING IN A PLURALITY OF TEMPORAL FRAMES

BACKGROUND OF THE INVENTION

1. Field of the Invention

The present invention relates to a frequency and phase locking method, and more particularly, to a frequency and phase locking method in a plurality of temporal frames.

2. Background

The telecommunications industry has developed various frequency and phase locking systems and methods for synchronizing time division multiplexed (TDM) signals in a plurality of temporal frames, such as synchronous optical network (SONET) frames. The SONET employs an industry-standard transmission format that is used for the transmission of various types of communication signals, such as telephony and video signals. The SONET frames are organized in a plurality of superframes, each superframe having a duration of 1 ms and containing eight frames each with a duration of 125 μs. A plurality of TDM cells, each having a known duration and containing a plurality of data bits, can be included in each of the SONET frames. In general, the SONET format and the time division multiplexing of digital data bits are conventional and well known to a person skilled in the art.

The SONET frames, which are in a temporal sequence during transmission, can be stored in a plurality of physical layer devices for signal processing. The SONET frames can be stored in a bank of SONET physical layer devices each adapted to capture a respective SONET frame. In order to schedule a plurality of TDM cells into a plurality of SONET frames for transmission over commercially available physical layer devices, such as those typically used in conventional asynchronous transfer mode (ATM) data communications equipment, it is important that the SONET frames be aligned in phase with respect to each other. Although various types of conventional phase locked loop and frequency locked loop circuits are available, they are not adapted to provide an accurate phase alignment of different SONET frames. Therefore, there is a need for a frequency and phase locking method to provide an accurate phase alignment of the SONET frames.

SUMMARY OF THE INVENTION

The present invention satisfies this need. In view of the above problem, the present invention provides a frequency and phase locking method that is able to accomplish accurate frequency locking and phase alignment of a plurality of temporal frames such as SONET frames. In an embodiment in which each of the frames is characterized by a frequency and a phase, the phase of the first frame referenced by a first reference frequency, the method roughly comprises the steps of:

(a) adjusting the first reference frequency to obtain a phase lock in the first frame;

(b) setting the phase of the subsequent frames in coherence with the phase of the first frame;

(c) tracking the phase of the first frame;

(d) determining whether the phase lock of the first frame is lost; and (e) repeating steps (a) through (b) if the phase lock of the first frame is lost.

In a further embodiment wherein the frequency of the first frame is referenced by a second reference frequency, the method further comprises the step of adjusting the second reference frequency to obtain a frequency lock in the first frame. If the phase lock of the first frame is lost for more than a predetermined time, the step of adjusting the second reference frequency may be repeated to obtain a frequency lock or a coarse phase lock before a fine phase lock is obtained by adjusting the first reference frequency.

Advantageously, the method according to the present invention is able to provide a fine phase lock of the first frame and an accurate phase alignment of subsequent frames with respect to the first frame. A further advantage of the present invention is that only one phase locked loop circuit is required to provide a fine phase lock of the first frame without the need to provide a separate phase locked loop circuit for each of the subsequent frames.

BRIEF DESCRIPTION OF THE DRAWINGS

The invention will be described with respect to particular embodiments thereof, and references will be made to the drawings in which.

DETAILED DESCRIPTION

Figure 1:
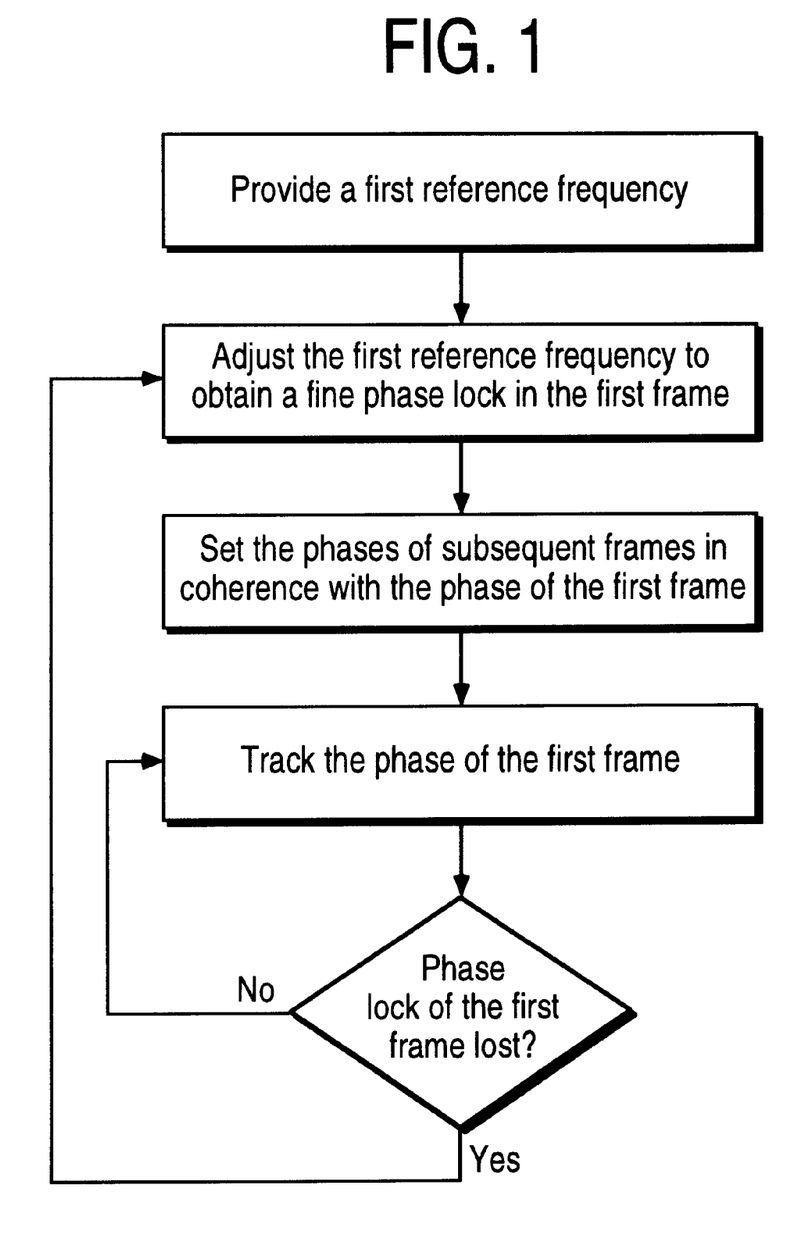
FIG. 1 is a flowchart illustrating a method of phase locking for a plurality of frames according to the present invention.

FIG. 1 is a simplified flowchart of an embodiment of the present invention which includes the steps of:

providing a first reference frequency;

adjusting the first reference frequency to obtain a fine phase lock in the first frame;

setting the phases of subsequent frames in coherence with the phase of the first frame;

tracking the phase of the first frame;

determining whether the phase lock of the first frame is lost;

repeating the step of adjusting the first reference frequency to obtain a fine phase lock in the first frame if the phase lock of the first frame is lost; and continuing the step of tracking the phase of the first frame if the phase lock is maintained.

The first reference frequency for the fine phase locking of the first frame can be provided by a conventional digital clock. If the clock frequency of an available clock is different from the desired first reference frequency, the first reference frequency can be obtained from the clock frequency through a synthesizer circuit, such as a frequency divider. For example, a conventional standard synchronous optical network (SONET) clock with an octal bus clock frequency of 16.384 MHz can be used as the reference clock, with a modulo M divider provided to divide the SONET octal bus clock frequency to obtain the first reference frequency. For example, if M is set to equal $2^{11}$, which is equal to 2048, the first reference frequency obtained by the frequency division would be 8,000 Hz, which is equivalent to a period of 125 µs, the period of a standard SONET frame. The first reference frequency may be adjusted, for example, by a phase locked loop which is connected to compare the reference clock frequency divided by the modulo M divider with the frame frequency provided by the first SONET device, which is adapted to store the first SONET frame in its memory. The phase locked loop compares the two frequencies, detects small phase errors, and provides an adjustment to the first reference frequency for the first SONET device, which stores the first SONET frame. While holding the frequency and phase of the first frame constant in the first SONET device, the phases of the frames subsequent in temporal sequence to the first frame are adjusted such that they are in coherence with the phase of the first frame to obtain an accurate phase alignment. The phase of the first frame is continually tracked by the phase locked loop. If the phase lock of the first frame is lost, the first reference frequency is further adjusted by the phase locked loop to obtain a fine phase lock in the first SONET frame.

Figure 2:
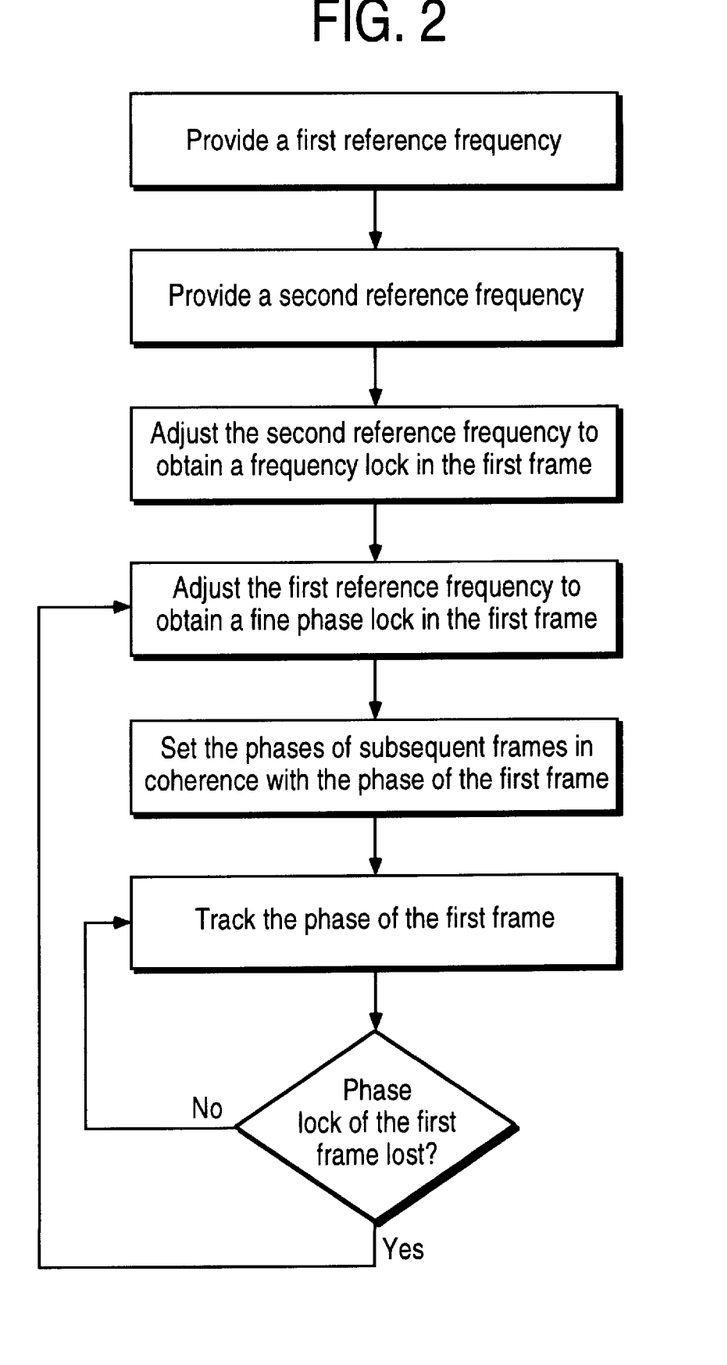
FIG. 2 is a flowchart illustrating another embodiment of the frequency and phase locking method according to the present invention.

FIG. 2 is a flowchart illustrating a further embodiment of the present invention with a second reference frequency provided to obtain a frequency lock, which is equivalent to a coarse phase lock prior to the fine phase lock in the first frame. In this embodiment, the method of frequency and phase locking comprises the steps of:

providing a first reference frequency;

providing a second reference frequency;

adjusting the second reference frequency to obtain a frequency lock in the first frame;

adjusting the first reference frequency to obtain a fine phase lock in the first frame;

setting the phases of subsequent frames in coherence with the phase of the first frame;

tracking the phase of the first frame;

determining whether the phase lock of the first frame is lost;

repeating the step of adjusting the first reference frequency to obtain a fine phase lock in the first frame if the phase lock of the first frame is lost; and continuing the step of tracking the phase of the first frame if the phase lock of the first frame is maintained.

The first and second reference frequencies may be provided by different clocks or by the same clock connected to two frequency dividers with two different divisors. For example, with a common SONET reference clock generating a clock frequency of 16.384 MHz, a modulo N divider can be provided to obtain the second reference frequency in addition to the modulo M divider for providing the first reference frequency. For example, N can be set to equal $2^{17}$, which is equal to 131072, to divide the SONET clock frequency of 16.384 MHz to obtain a second reference frequency of 125 Hz. A digital frequency of 125 Hz is equivalent to a period of 8 ms.

Furthermore, prior to the step of adjusting the first reference frequency to obtain a fine phase lock in the first frame, the second reference frequency is adjusted to obtain a frequency lock such that the frequency of the first SONET frame is held constant to facilitate the fine phase locking of the first frame. The frequency locking by adjusting the second reference frequency may be regarded as a coarse phase locking, which may be implemented as a preparatory step for the fine phase locking. After the first and second reference frequencies are adjusted to obtain a fine phase locking of the first frame, the phases of the subsequent frames are set in coherence with the phase of the first frame while the phase and frequency of the first frame are held constant to obtain an accurate phase alignment between the subsequent frames and the first frame. The step of setting the phases of the subsequent frames can be achieved, for example, by a plurality of respective drop clock signals for adjusting the phases of the subsequent frames. The drop clock signals can be generated by a drop clock logic circuit that provides a predetermined digital phase shift to each of the SONET devices for storing the respective subsequent frames. For example, the drop clock signals may be adapted to provide a predetermined fixed phase shift between immediately adjacent frames, such that the phase of each of the subsequent frames is accurately defined with respect to the phase of the first frame. The phases of the subsequent frames may be shifted in small increments or decrements, for example, until the phase difference between the subsequent frames and the first frame is 0° for a strict phase alignment.

Figure 3:
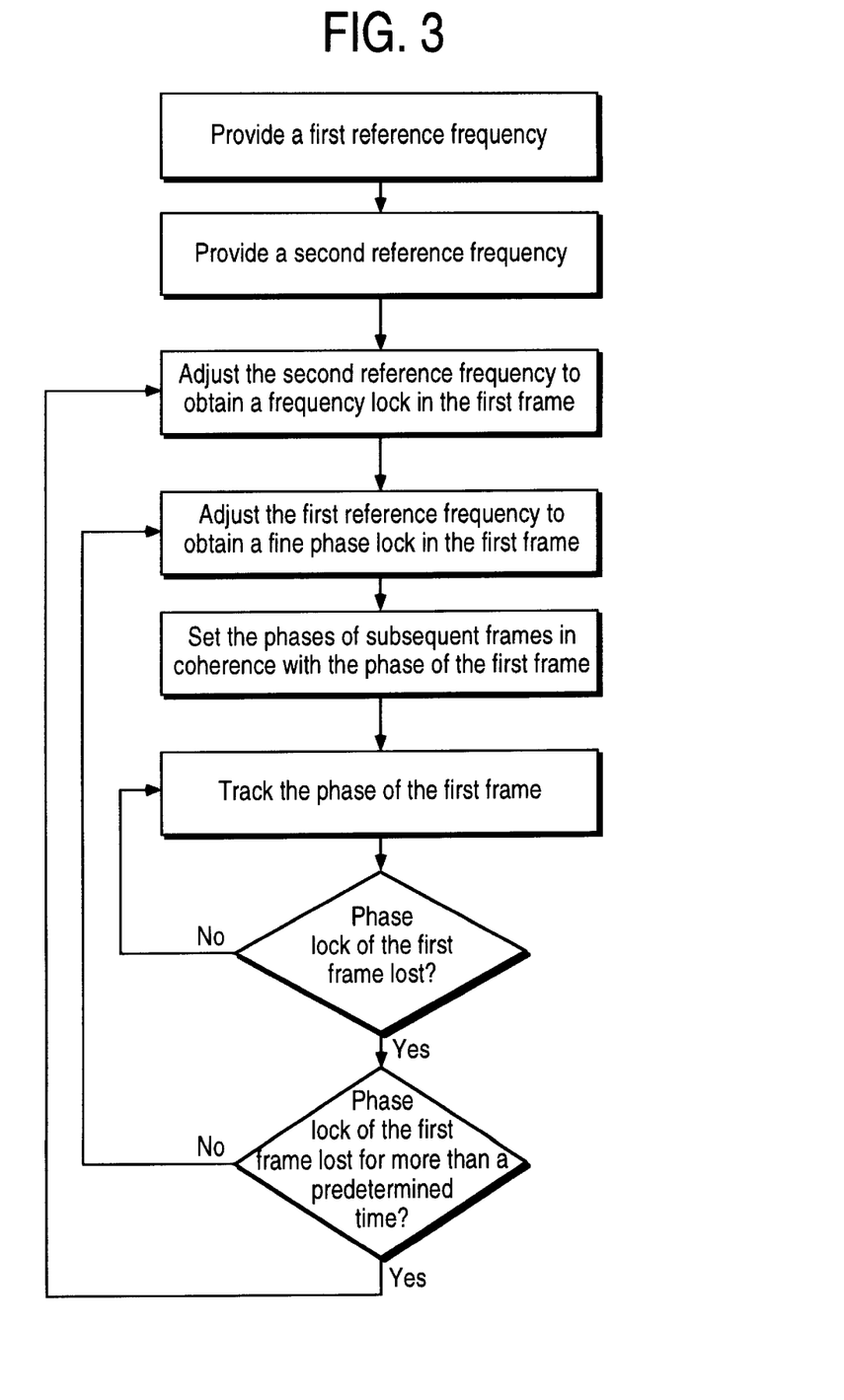
FIG. 3 is a flowchart illustrating yet another embodiment of the frequency and phase locking method according to the present invention.

FIG. 3 is a flowchart illustrating yet a further embodiment of the present invention similar to the embodiment illustrated in FIG. 2, but with an additional decision process for adjusting the second reference frequency if the phase lock of the first frame is lost for more than a relatively long time. In this embodiment, the method comprises the steps of:

providing a first reference frequency;

providing a second reference frequency;

adjusting the second reference frequency to obtain a frequency lock in the first frame;

adjusting the first reference frequency to obtain a fine phase lock in the first frame;

setting the phases of subsequent frames in coherence with the phase of the first frame;

tracking the phase of the first frame;

determining if the phase lock of the first frame is lost;

continuing the step of tracking the phase of the first frame if the phase lock is maintained;

determining whether the phase lock of the first frame is lost for more than a predetermined time;

adjusting the first reference frequency to obtain a fine phase lock in the first frame if the phase lock is lost for not more than the predetermined time; and adjusting the second reference frequency to obtain a frequency lock in the first frame if the phase lock of the first frame is lost for more than the predetermined time.

The first and second reference frequencies may be provided by separate SONET clocks or by the same SONET clock with two frequency dividers as described above. In general, the frequency lock provides a coarse phase lock prior to the fine phase lock. Therefore, the second reference frequency for frequency locking is usually lower than the first reference frequency for phase locking. If modulo M and modulo N dividers are connected to the same SONET reference clock to provide the first and second reference frequencies, respectively, then the number M should be less than the number N such that the first reference frequency is higher than the second reference frequency. In the illustrative example described above in which M equals $2^{11}$, N equals $2^{17}$ and the reference clock frequency is 16.384 MHz, the first and second reference frequencies are 8,000 Hz and 125 Hz, respectively. The first reference frequency is thus 64 times the second reference frequency. In order to adjust the second reference frequency to achieve a coarse phase locking, the second reference frequency may be adjusted in a frequency locked loop that compares the second reference frequency, which is provided by the SONET reference clock connected to the modulo N divider, and the output frequency of the frequency locked loop divided by a fixed number. If there is a difference between these frequencies, the frequency locked loop adjusts the second reference frequency for the first SONET frame to eliminate the difference. The frequency locked loop and the phase locked loop may be combined in a single frequency/phase locked loop circuit with frequency and phase comparators providing higher and lower order bits, respectively, to a digital shift register that provides correction signals to a digital to analog converter, which in response generates a control voltage for a voltage controlled oscillator that provides the output clock frequency of the circuit. For example, the voltage controlled oscillator can generate an output clock frequency to provide clocking signals for each of the SONET frame devices with a frequency of 19.44 MHz. This frequency can be conveyed in a feedback loop to a modulo $(F_s/F_r)N$ divider. In this example, the divisor $(F_s/F_r)N$ is equal to $(19.44/16.384) \times 2^{17} = 155520$. The output frequency of the frequency/phase locked loop, which is 19.44 MHz, is divided by 155520 to obtain a frequency of 125 Hz. If the voltage controlled oscillator generates a frequency deviating from the standard 19.44 MHz, the frequency cooperator detects a frequency error and adjusts the output clock frequency accordingly. obtaining a frequency lock prior to obtaining a fine phase lock in the first frame may be desirable in some applications although not critical in all applications to enable a fine phase lock in the first frame.

After a fine phase lock in the first frame is achieved, the phases of the subsequent frames are set in coherence with the phase of the first frame to obtain a precise phase alignment, for example, by using a plurality of drop clock signals in the same manner as described above. A drop clock logic circuit, for example, can provide the digital drop clock signals to the respective subsequent frames, with a predetermined fixed phase shift between the immediately adjacent frames. To obtain a precise alignment of the phases of the subsequent frames with respect to the phase of the first frame, the drop clock device can be programmed to detect a phase difference between any of the subsequent frames out of phase with respect to the first frame, and to adjust the phases of the subsequent frames accordingly to achieve a phase alignment. In the meantime, the phase and frequency of the first frame is continually tracked by the frequency/phase locked loop. If the phase lock of the first frame is lost, the first reference frequency can be instantaneously adjusted in small steps to re-engage in a fine phase lock in the first frame. If the phase lock of the first frame is lost for more than a predetermined time, for example, 15 seconds, the second reference frequency can be adjusted to obtain a frequency lock, which is equivalent to a coarse phase lock in the first frame. Although it is expected that a fine phase lock in the first frame can be maintained by only adjusting the first reference frequency for the phase locked loop, the second reference frequency is able to provide further stability in the phase locking of the first frame if the first reference frequency is unable to maintain a fine phase lock in the first frame for a long time. The second reference frequency can be adjusted in small increments or decrements, for example, by pulling the voltage controlled oscillator in the frequency/phase locked loop circuit in small frequency steps to obtain a frequency lock. The first reference frequency may be adjusted by using the period of a standard SONET frame, that is, 125 µs, from the first frame device, in a phase comparison with the first reference frequency to obtain a fine phase lock of the first frame.

Figure 4:
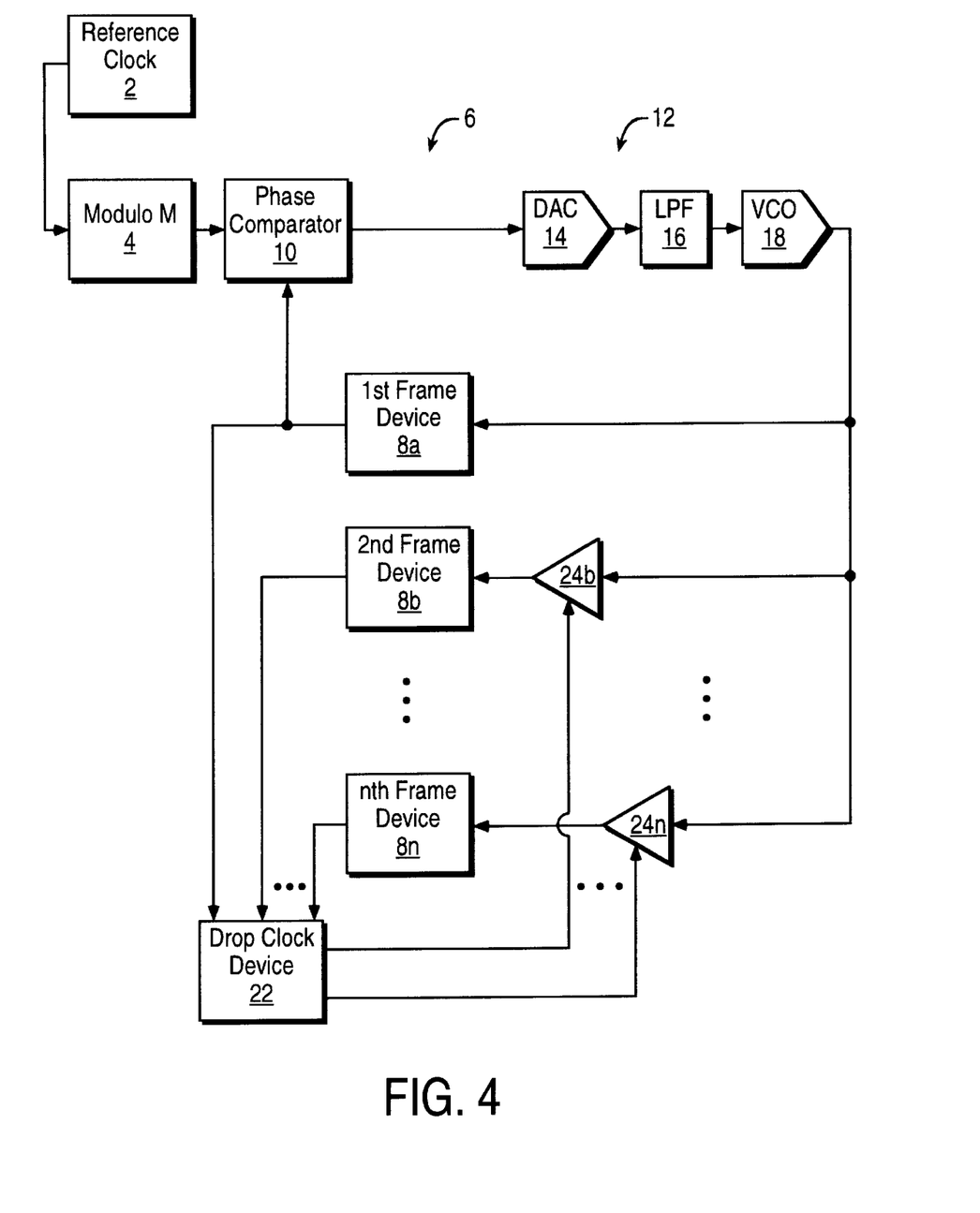
FIG. 4 is a block diagram showing an example of a phase locking apparatus in which the method according to the present invention may be implemented.

FIG. 4 shows a block diagram of an example of a phase locking apparatus in which the method according to the present invention may be implemented. A reference clock 2, such as a standard SONET reference clock, provides a standard input reference frequency of 16.384 MHz. This input reference frequency is fed to a modulo M divider 4 providing a predetermined first divisor, for example, $2^{11}$, which is equal to 2048, to divide the input reference frequency to obtain the first reference frequency for the phase locking of the first frame. For an industry-standard SONET frame, the first reference frequency can be conveniently set at 8,000 Hz. A phase locked loop 6, which adjusts the first reference frequency to obtain a phase lock of the first frame in the first frame device 8a, includes a phase comparator 10 which compares the first reference frequency provided by the modulo M divider 4 and the frame frequency of the first frame output from the first frame device 8a. Since both the first reference frequency and the SONET frame frequency are 8,000 Hz, which is equivalent to a period of 125 µs, a small phase shift can be detected by the phase comparator 10 which generates an error signal in a digital format. The phase locked loop 6 further includes a clock signal generator 12, which outputs a clock signal to lock the phase of the first SONET frame in the first frame device 8a. The clock signal generator 12 may comprise a digital to analog converter 14 connected to the phase comparator 10 to convert the digital phase error signal to an analog voltage signal, a low pass filter 16 connected to the digital to analog converter 14 to filter out high-frequency jitters in the analog signal, and a voltage controlled oscillator 18 connected to the low-pass filter 16 to generate the output clock signal for the phase locking of the first frame in the first frame device 8a. If a phase error in the first frame device 8a still exists, the phase locked loop 6 continues to adjust the first reference frequency until a fine phase lock in the first frame device 8a is obtained.

The phase locking apparatus suitable for the implementation of the method according to the present invention further includes at least one subsequent frame device, which usually comprises a plurality of subsequent frame devices 8b . . . 8n, capable of receiving and storing a plurality of subsequent frames from the second frame to the $n^{th}$ frame, respectively. The subsequent frame devices 8b . . . 8n are also coupled to receive the phase locked clock signal from the clock signal generator 12 in the phase locked loop 6. A drop clock device 22 can be connected to the first frame device 8a to detect the phase of the first frame and further coupled to the subsequent frame devices 8b . . . 8n to set the phases of the subsequent frames, respectively, in coherence with the phase of the first frame in the first frame device 8a. A plurality of phase shifters 24b . . . 24n can be coupled between the subsequent frame devices 8b . . . 8n, respectively, and the voltage controlled oscillator 18, and further coupled to receive the respective drop clock signals from the drop clock device 22 which provides a predetermined phase shift for each of the subsequent frames. Depending upon the application, the predetermined phase shift for each of the subsequent frames may be a fixed phase shift between immediately adjacent frames for phase coherence. The phases of the subsequent frames may be shifted such that the phase difference between the subsequent frames and the first frame is 0° for a strict phase alignment of the subsequent frames with respect to the first frame.

The drop clock device 22 may be further coupled to the subsequent frame devices 8b . . . 8n to sense the phase shifts of the subsequent frames in the subsequent frame devices 8b . . . 8n, respectively, and in response, to adjust the phases of the subsequent frames according to the predetermined phase shift. The drop clock device 22 may be a digital device that generates a plurality of digital drop clock signals, and the phase shifters 24b . . . 24n may be digital phase shifters which shift the phases of the subsequent frames in the subsequent frame devices 8b . . . 8n in response to the respective drop clock signals from the drop clock device 22. The apparatus shown in FIG. 4 and described above is only one example of an apparatus to perform the method of the present invention. However, the method according to the present invention is not limited to that which can be performed by the apparatus of FIG. 4 and described above; other apparatus can also be used to perform the method of the present invention.

Figure 5:
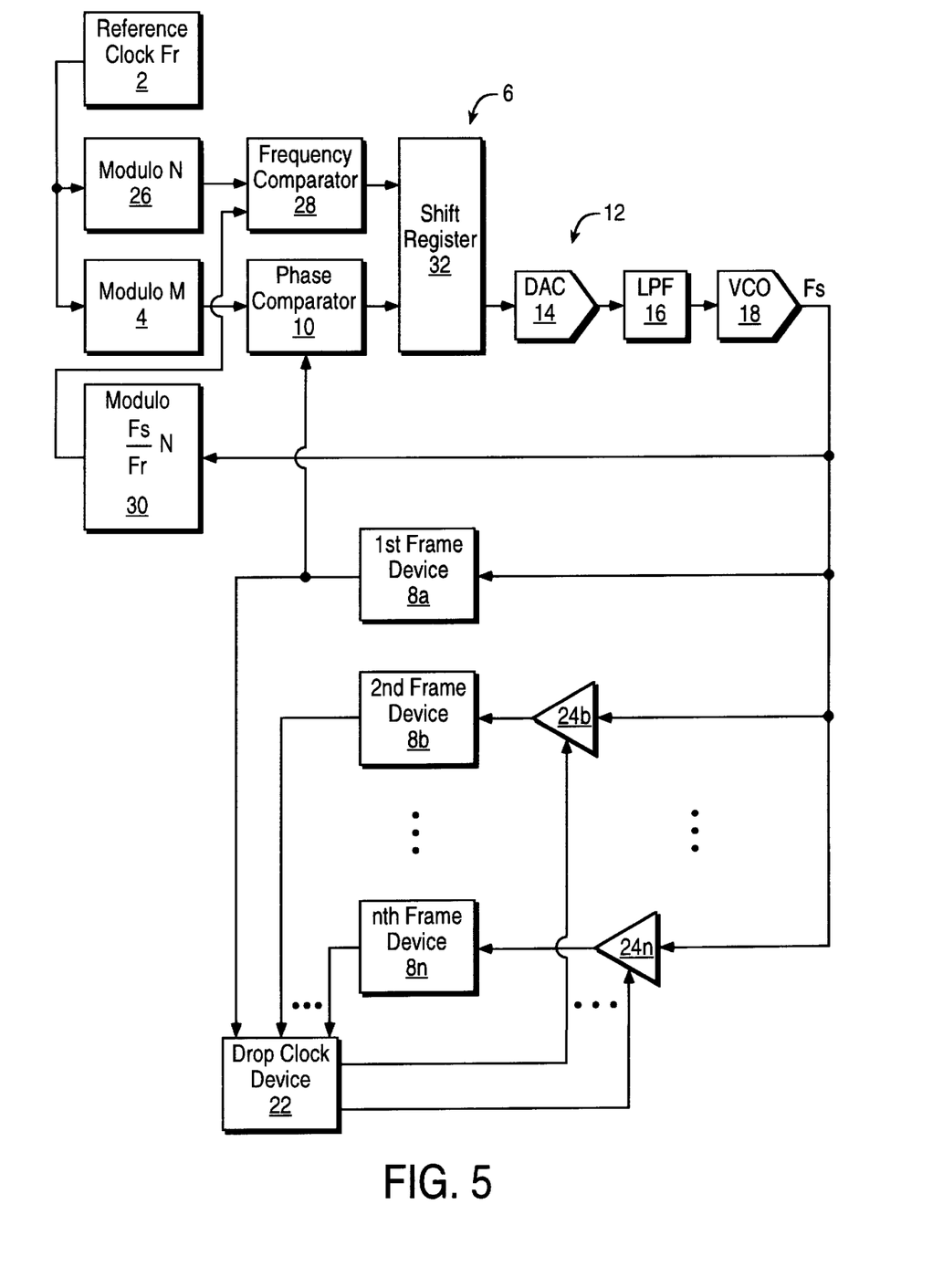
FIG. 5 is a block diagram showing another example of a frequency and phase locking apparatus in which the method according to the present invention may be implemented.

FIG. 5 shows a block diagram of another example of an apparatus adapted to perform the process steps in the method according to the present invention. The reference clock 2 generates an input reference frequency $F_r$ which is fed to first and second frequency dividers 4 and 26 with first and second divisors M and N, respectively. The first frequency divider 4 provides the first reference frequency while the second frequency divider 26 provides the second reference frequency. Since the second reference frequency is used for fine phase tracking whereas the second reference frequency is used for frequency tracking, which may be considered as coarse phase tracking, the first reference frequency is usually higher than the second reference frequency. Since both first and second frequencies are provided by the same reference clock 2, the first divisor M should be less than the second divisor N. In addition to the phase comparator 10 which compares the phases of the first reference frequency from the first frequency divider 4 and the frame frequency from the first frame device 8a, a frequency comparator 28 is connected to compare the second reference frequency generated by the second frequency divider 26 with a scaled output frequency provided by a third frequency divider 30. The third frequency divider 30 is connected to the output of the voltage controlled oscillator 18 of the clock signal generator 12 in the phase locked loop 6. The output clock signal frequency, which is the same as that fed to the frame devices 8a, 8b, . . . 8n, is divided by a predetermined third divisor in the third frequency divider 30 to generate a scaled feedback frequency for comparison with the second reference frequency in the frequency comparator 28.

Based upon the frequency and phase comparisons, the frequency and phase comparators 28, 10 generate frequency and phase error signals, respectively, for coarse and fine phase corrections, respectively. The clock signal generator 12 may further comprise a digital shift register coupled to receive the digital frequency and phase error signals from the frequency and phase comparators 28, 10, respectively, and in response, to generate a digital correction signal to be fed to the digital to analog converter 14. Since the frequency comparator 28 provides a coarse phase error whereas the phase comparator 10 provides a fine phase error, the shift register 32 may be connected to receive the frequency error signal from the frequency comparator 28 as higher order bits and the phase error signal from the phase comparator 10 as lower order bits. The digital correction signal received by the digital to analog converter 14 is thus a composite correction signal for both coarse and fine phase adjustments. The analog voltage signal generated by the digital to analog converter 14 passes through a low-pass filter 16, which filters out high-frequency jitters in the analog signal, to the voltage controlled oscillator 18, which generates the clock signal for the first and subsequent frames in the respective frame devices 8a, 8b, . . . 8n.

For a typical SONET application, the voltage controlled oscillator 18 may be adapted to generate an output clock frequency of 19.44 MHz, and a 12-bit digital to analog converter may be used as the digital to analog converter 14 to generate the analog control voltage signal for the voltage controlled oscillator 18. The output clock frequency, which is the clock frequency for the SONET frame devices 8a, 8b . . . 8n, is fed to the third frequency divider 30 with a divisor of $(F_s/F_r)N$, wherein $F_s$ is the output clock frequency generated by the voltage controlled oscillator 18, $F_r$ is the input reference frequency generated by the reference clock 2, and N is the divisor in the second frequency divider 26. In this SONET application, for example, $F_s$ equals 19.44 MHz, $F_r$ equals 16.384 MHz, and N equals $2^{17}$ which is 131072. Therefore, the divisor in the third frequency divider 30 is 155520, a number by which the output clock frequency of 19.44 MHz is divided to obtain a frequency of 125 Hz. This frequency is consistent with the second reference frequency, which is generated by dividing the input reference clock frequency of 16.384 MHz by $N=2^{17}$ in the second frequency divider 26. If there is a difference between these frequencies, the frequency comparator 28 detects the frequency difference and generates a frequency error signal which is fed to the shift register 32 for coarse phase adjustment.

In a manner similar to that which is shown in FIG. 4 and described above, a plurality of frame devices 8a, 8b, . . . 8n including the first frame device 8a and subsequent frame devices 8b . . . 8n are provided to receive the first and subsequent frames, respectively. The clock signal generator 12 in the phase locked loop 6 provides the same clock signal to each of the frame devices 8a, 8b, . . . 8n. The drop clock device 22 is connected to the output of the first frame 8a and coupled to provide a predetermined phase shift for each of the subsequent frames stored in the subsequent frame devices 8b . . . 8n to lock the phases of the subsequent frames in coherence with the phase of the first frame. The predetermined phase shift may be a fixed phase shift between immediately adjacent frames for phase coherence. The phases of the subsequent frames may be shifted such that the phase difference between the subsequent frames and the first frame is 0° for a strict phase alignment of the subsequent frames with respect to the first frame. The drop clock device 22 may be connected to provide digital phase shift signals to the digital phase shifters 24b . . . 24n, which are connected to shift the phases of the output clock signal for the subsequent frame devices 8b . . . 8n, respectively. The drop clock device 22 may be further connected to the outputs of the subsequent frame devices 8b . . . 8n to sense actual phase shifts of the subsequent frames and in response, to adjust the phases of the subsequent frames through the phase shifters 24b . . . 24n, respectively, according to the predetermined phase shifts. The phases of the subsequent frames in the subsequent frame devices 24b . . . 24n may be incremented or decremented in small steps, for example, until the phase shift in each of the subsequent frames with respect to the first frame is 0°.

The apparatus shown in FIG. 5 and described above is merely another example of an apparatus in which the method according to the present invention may be implemented. However, the method according to the present invention is not limited to that which can be performed by either one of the apparatus shown in FIGS. 4 and 5 and described above. It will be appreciated that other apparatus can also be used to perform the process steps in the method according to the present invention. The principles of the invention will nonetheless still apply.

The invention has been described with respect to particular embodiments thereof, and numerous modifications can be made which are within the scope of the invention as set forth in the claims.

What is claimed is:

1. A method of phase locking in a plurality of temporal frames including a first frame and at least one subsequent frame, each frame characterized by a frequency and a phase, the phase of the first frame referenced by a first reference frequency, the method comprising the steps of:
   (a) adjusting the first reference frequency to obtain a phase lock in the first frame;
   (b) setting the phase of the at least one subsequent frame in coherence with the phase of the first frame;
   (c) tracking the phase of the first frame;
   (d) determining whether the phase lock of the first frame is lost; and
   (e) repeating steps (a) through (b) if the phase lock of the first frame is lost.

2. The method of claim 1, wherein the frequency of the first frame is referenced by a second reference frequency, further comprising the step of adjusting the second reference frequency to obtain a frequency lock in the first frame.

3. The method of claim 2, further comprising the steps of:
   (f) determining whether the phase lock of the first frame is lost for more than a predetermined time; and
   (g) repeating the step of adjusting the second reference frequency if the phase lock of the first frame is lost for more than the predetermined time.

4. The method of claim 2, further comprising the step of providing a reference clock frequency adapted to provide the first and second reference frequencies.

5. The method of claim 4, further comprising the steps of:
   dividing the reference clock frequency by a first divisor to obtain the first reference frequency; and
   dividing the reference clock frequency by a second divisor to obtain the second reference frequency.

6. The method of claim 5, wherein the first divisor is less than the second divisor.

7. The method of claim 1, wherein the step of setting the phase of the at least one subsequent frame comprises the steps of:
   (i) generating at least one drop clock signal corresponding to the at least one subsequent frame; and
   (ii) shifting the phase of the at least one subsequent frame respectively according to the at least one drop clock signal while holding the phase and frequency of the first frame constant.

8. The method of claim 7, wherein the step of generating the at least one drop clock signal comprises the step of providing a predetermined phase shift for the at least one subsequent frame.

9. The method of claim 1, wherein the at least one subsequent frame comprises a plurality of subsequent frames, and the step of setting the phase of the at least one subsequent frame comprises the step of setting the phases of the plurality of subsequent frames.

10. The method of claim 9, wherein the frequency of the first frame is referenced by a second reference frequency, further comprising the step of adjusting the second reference frequency to obtain a frequency lock in the first frame.

11. The method of claim 10, further comprising the steps of:
    (f) determining whether the phase lock of the first frame is lost for more than a predetermined time; and
    (g) repeating the step of adjusting the second reference frequency if the phase lock of the first frame is lost for more than the predetermined time.

12. The method of claim 9, wherein the step of setting the phases of the plurality of subsequent frames comprises the steps of:
    (i) generating a plurality of drop clock signals respectively for the plurality of subsequent frames; and
    (ii) shifting the phases of the subsequent frames respectively according to the plurality of drop clock signals while holding the phase and frequency of the first frame constant.

13. The method of claim 12, wherein the step of generating the plurality of drop clock signals comprises the step of providing a predetermined phase shift for each of the subsequent frames.

14. The method of claim 13, wherein the predetermined phase shift is 0°.

15. The method of claim 13, wherein the step of providing the predetermined phase shift comprises the step of providing a fixed phase shift between immediately adjacent frames in the plurality of frames.

16. A method of frequency and phase locking in a plurality of temporal frames including a first frame and at least one subsequent frame, each frame characterized by a frequency and a phase, the phase of the first frame referenced by a first reference frequency and the frequency of the first frame referenced by a second reference frequency, the method comprising the steps of:
    (a) adjusting the second reference frequency to obtain a frequency lock in the first frame;
    (b) adjusting the first reference frequency to obtain a phase lock in the first frame;
    (c) setting the phase of the at least one subsequent frame in coherence with the phase of the first frame;
    (d) tracking the phase of the first frame;
    (e) determining whether the phase lock of the first frame is lost; and
    (f) repeating steps (b) through (c) if the phase lock of the first frame is lost.

17. The method of claim 16, further comprising the steps of:
    (g) determining whether the phase lock of the first frame is lost for more than a predetermined time; and
    (h) repeating steps (a) through (c) if the phase lock of the first frame is lost for more than the predetermined time.

18. The method of claim 16, wherein the step of setting the phase of the at least one subsequent frame comprises the steps of:
    (i) generating at least one drop clock signal corresponding to the at least one subsequent frame; and
    (ii) shifting the phase of the at least one subsequent frame respectively according to the at least one drop clock signal while holding the phase and frequency of the first frame constant.

19. The method of claim 18, wherein the step of generating the at least one drop clock signal comprises the step of providing a predetermined phase shift for the at least one subsequent frame.

20. The method of claim 16, wherein the at least one subsequent frame comprises a plurality of subsequent frames, and the step of setting the phase of the at least one subsequent frame comprises the step of setting the phases of the plurality of subsequent frames.

21. The method of claim 20, further comprising the steps of:
    (g) determining whether the phase lock of the first frame is lost for more than a predetermined time; and
    (h) repeating steps (a) through (c) if the phase lock of the first frame is lost for more than the predetermined time.

22. The method of claim 20, wherein the step of setting the phases of the plurality of subsequent frames comprises the steps of:

(i) generating a plurality of drop clock signals respectively for the plurality of subsequent frames; and (ii) shifting the phases of the subsequent frames respectively according to the plurality of drop clock signals while holding the phase and frequency of the first frame constant.

23. The method of claim 22, wherein the step of generating the plurality of drop clock signals comprises the step of providing a predetermined phase shift for each of the subsequent frames.

24. The method of claim 23, wherein the predetermined phase shift is 0°.

25. The method of claim 23, wherein the step of providing the predetermined phase shift comprises the step of providing a fixed phase shift between immediately adjacent frames in the plurality of frames.

26. The method of claim 16, further comprising the step of providing a reference clock frequency adapted to provide the first and second reference frequencies.

27. The method of claim 26, further comprising the steps of:

dividing the reference clock frequency by a first divisor to obtain the first reference frequency; and dividing the reference clock frequency by a second divisor to obtain the second reference frequency.

28. The method of 27, wherein the first divisor is less than the second divisor.

29. A method of frequency and phase locking in a plurality of temporal frames including a first frame and at least one subsequent frame, each frame characterized by a frequency and a phase, the phase of the first frame referenced by a first reference frequency and the frequency of the first frame referenced by a second reference frequency, the method comprising the steps of:

(a) adjusting the second reference frequency to obtain a frequency lock in the first frame;

(b) adjusting the first reference frequency to obtain a phase lock in the first frame;

(c) setting the phase of the at least one subsequent frame in coherence with the phase of the first frame;

(d) tracking the phase of the first frame;

(e) determining whether the phase lock of the first frame is lost;

(f) repeating steps (b) through (c) if the phase lock of the first frame is lost;

(g) determining whether the phase lock of the first frame is lost for more than a predetermined time; and (h) repeating steps (a) through (c) if the phase lock of the first frame is lost for more than the predetermined time.

30. The method of claim 29, wherein the step of setting the phase of the at least one subsequent frame comprises the steps of:

(i) generating at least one drop clock signal corresponding to the at least one subsequent frame; and (ii) shifting the phase of the at least one subsequent frame respectively according to the at least one drop clock signal while holding the phase and frequency of the first frame constant.

31. The method of claim 30, wherein the step of generating the at least one drop clock signal comprises the step of providing a predetermined phase shift for the at least one subsequent frame.

32. The method of claim 29, wherein the at least one subsequent frame comprises a plurality of subsequent frames, and the step of setting the phase of the at least one subsequent frame comprises the step of setting the phases of the plurality of subsequent frames.

33. The method of claim 32, wherein the step of setting the phases of the plurality of subsequent frames comprises the steps of:

(i) generating a plurality of drop clock signals respectively for the plurality of subsequent frames; and (ii) shifting the phases of the plurality of subsequent frames respectively according to the drop clock signals while holding the phase and frequency of the first frame constant.

34. The method of claim 33, wherein the step of generating the plurality of drop clock signals comprises the step of providing a predetermined phase shift for each of the subsequent frames.

35. The method of claim 34, wherein the predetermined phase shift is 0°.

36. The method of claim 34, wherein the step of providing the predetermined phase shift comprises the step of providing a fixed phase shift between immediately adjacent frames in the plurality of frames.

37. The method of claim 29, further comprising the step of providing a reference clock frequency adapted to provide the first and second reference frequencies.

38. The method of claim 37, further comprising the steps of:

dividing the reference clock frequency by a first divisor to obtain the first reference frequency; and dividing the reference clock frequency by a second divisor to obtain the second reference frequency.

39. The method of claim 38, wherein the first divisor is less than the second divisor.

40. A method of frequency and phase locking in a plurality of temporal frames including a first frame and at least one subsequent frame, each frame characterized by a frequency and a phase, the method comprising the steps of:

(a) providing a first reference frequency adapted to reference the phase of the first frame;

(b) providing a second reference frequency adapted to reference the frequency of the first frame;

(c) adjusting the second reference frequency to obtain a frequency lock in the first frame;

(d) adjusting the first reference frequency to obtain a phase lock in the first frame;

(e) setting the phase of the at least one subsequent frame in coherence with the phase of the first frame;

(f) tracking the phase of the first frame;

(g) determining whether the phase lock of the first frame is lost;

(h) repeating steps (d) through (e) if the phase lock of the first frame is lost;

(i) determining whether the phase lock of the first frame is lost for more than a predetermined time; and (j) repeating steps (c) through (e) if the phase lock of the first frame is lost for more than the predetermined time.

41. The method of claim 40, wherein the step of setting the phase of the at least one subsequent frame comprises the steps of:

generating at least one drop clock signal corresponding to the at least one subsequent frame; and shifting the phase of the at least one subsequent frame respectively according to the at least one drop clock signal while holding the phase and frequency of the first frame constant.

42. The method of claim 41, wherein the step of generating the at least one drop clock signal comprises the step of providing a predetermined phase shift for the at least one subsequent frame.

43. The method of claim 40, wherein the at least one subsequent frame comprises a plurality of subsequent frames, and the step of setting the phase of the at least one subsequent frame comprises the step of setting the phases of the plurality of subsequent frames.

44. The method of claim 43, wherein the step of setting the phases of the plurality of subsequent frames comprises the steps of:

generating a plurality of drop clock signals respectively for the plurality of subsequent frames; and shifting the phases of the plurality of subsequent frames respectively according to the drop clock signals while holding the phase and frequency of the first frame constant.

45. The method of claim 44, wherein the step of generating the plurality of drop clock signals comprises the step of providing a predetermined phase shift for each of the subsequent frames.

46. The method of claim 45, wherein the predetermined phase shift is 0°.

47. The method of claim 45, wherein the step of providing the predetermined phase shift comprises the step of providing a fixed phase shift between immediately adjacent frames in the plurality of frames.

48. The method of claim 40, further comprising the step of providing a reference clock frequency adapted to provide the first and second reference frequencies.

49. The method of claim 48, wherein the step of providing the first reference frequency includes the step of dividing the reference clock frequency by a first divisor, and the step of providing the second reference frequency includes the step of dividing the reference clock frequency by a second divisor.

50. The method of claim 49, wherein the first divisor is less than the second divisor.

51. A method of frequency and phase locking in a plurality of synchronous frames including a first frame and at least one subsequent frame, each frame characterized by a frequency and a phase, the phase of the first frame referenced by a first reference frequency and the frequency of the first frame referenced by a second reference frequency, the method comprising the steps of:

(a) adjusting the second reference frequency to obtain a frequency lock in the first frame;

(b) adjusting the first reference frequency to obtain a phase lock in the first frame;

(c) generating at least one drop clock signal corresponding to the at least one subsequent frame;

(d) setting the phase of the at least one subsequent frame in coherence with the phase of the first frame respectively according to the at least one drop clock signal while holding the phase and frequency of the first frame constant;

(e) tracking the phase and frequency of the first frame;

(f) determining whether the phase lock of the first frame is lost; and (g) repeating steps (b) through (d) if the phase lock of the first frame is lost.

52. The method of claim 51, further comprising the steps of:

(h) determining whether the phase lock of the first frame is lost for more than a predetermined time; and (i) repeating steps (a) through (d) if the phase lock of the first frame is lost for more than the predetermined time.

53. The method of claim 51, wherein the step of generating the at least one drop clock signal comprises the step of providing a predetermined phase shift for the at least one subsequent frame.

54. The method of claim 53, wherein the predetermined phase shift is 0°.

55. The method of claim 53, wherein the at least one subsequent frame comprises a plurality of subsequent frames.

56. The method of claim 55, further comprising the steps of:

(h) determining whether the phase lock of the first frame is lost for more than a predetermined time; and (i) repeating steps (a) through (d) if the phase lock of the first frame is lost for more than the predetermined time.

57. The method of claim 55, wherein the step of generating the at least one drop clock signal comprises the step of generating a plurality of drop clock signals respectively for the plurality of subsequent frames, and the step of setting the phase of the at least one subsequent frame comprises the step of shifting the phases of the plurality of subsequent frames respectively according to the drop clock signals while holding the phase and frequency of the first frame constant.

58. The method of claim 57, wherein the step of generating the plurality of drop clock signals comprises the step of providing a predetermined phase shift for each of the subsequent frames.

59. The method of claim 58, wherein the predetermined phase shift is 0°.

60. The method of claim 58, wherein the step of providing the predetermined phase shift comprises the step of providing a fixed phase shift between immediately adjacent frames in the plurality of frames.

61. The method of claim 51, further comprising the step of providing a reference clock frequency adapted to provide the first and second reference frequencies.

62. The method of claim 61, further comprising the steps of:

dividing the reference clock frequency by a first divisor to obtain the first reference frequency; and dividing the reference clock frequency by a second divisor to obtain the second reference frequency.

63. The method of claim 62, wherein the first divisor is less than the second divisor.

64. A method of frequency and phase locking in a plurality of synchronous frames including a first frame and a plurality of subsequent frames, each frame characterized by a frequency and a phase, the method comprising the steps of:

(a) providing a first reference frequency adapted to reference the phase of the first frame;

(b) providing a second reference frequency adapted to reference the frequency of the first frame;

(c) adjusting the second reference frequency to obtain a frequency lock in the first frame;

(d) adjusting the first reference frequency to obtain a phase lock in the first frame;

(e) generating a plurality of drop clock signals respectively for the plurality of subsequent frames;

(f) setting the phases of the subsequent frames in coherence with the phase of the first frame respectively according to the drop clock signals while holding the phase and frequency of the first frame constant;

(g) tracking the phase and frequency of the first frame;

(h) determining whether the phase lock of the first frame is lost; and (i) repeating steps (d) through (f) if the phase lock of the first frame is lost.

65. The method of claim 64, further comprising the steps of:

(j) determining whether the phase lock of the first frame is lost for more than a predetermined time; and (k) repeating steps (c) through (f) if the phase lock of the first frame is lost for more than the predetermined time.

66. The method of claim 64, wherein the step of setting the phases of the subsequent frames comprises the step of shifting the phases of the subsequent frames respectively according to the drop clock signals while holding the phase and frequency of the first frame constant.

67. The method of claim 64, wherein the step of generating the plurality of drop clock signals comprises the step of providing a predetermined phase shift for each of the subsequent frames.

68. The method of claim 67, wherein the predetermined phase shift is 0°.

69. The method of claim 67, wherein the step of providing the predetermined phase shift comprises the step of providing a fixed phase shift between immediately adjacent frames in the plurality of frames.

70. The method of claim 64, further comprising the step of providing a reference clock frequency adapted to provide the first and second reference frequencies.

71. The method of claim 70, wherein the step of providing the first reference frequency comprises the step of dividing the reference clock frequency by a first divisor, and the step of providing the second reference frequency comprises the step of dividing the reference clock frequency by a second divisor.

72. The method of claim 71, wherein the first divisor is less than the second divisor.

73. A method of frequency and phase locking in a plurality of synchronous frames including a first frame and a plurality of subsequent frames, each frame characterized by a frequency and a phase, the method comprising the steps of:

(a) providing a first reference frequency adapted to reference the phase of the first frame;

(b) providing a second reference frequency adapted to reference the frequency of the first frame;

(c) adjusting the second reference frequency to obtain a frequency lock in the first frame;

(d) adjusting the first reference frequency to obtain a phase lock in the first frame;

(e) generating a plurality of drop clock signals respectively for the plurality of subsequent frames;

(f) setting the phases of the subsequent frames in coherence with the phase of the first frame respectively according to the drop clock signals while holding the phase and frequency of the first frame constant;

(g) tracking the phase and frequency of the first frame;

(h) determining whether the phase lock of the first frame is lost;

(i) repeating steps (d) through (f) if the phase lock of the fir s t frame is lost;

(j) determining whether the phase lock of the first frame is lost for more than a predetermined time; and (k) repeating steps (c) through (f) if the phase lock of the first frame is lost for more than the predetermined time.

74. The method of claim 73, wherein the step of setting the phases of the subsequent frames comprises the step of shifting the phases of the subsequent frames respectively according to the drop clock signals while holding the phase and frequency of the first frame constant.

75. The method of claim 73, wherein the step of generating the plurality of drop clock signals comprises the step of providing a predetermined phase shift for each of the subsequent frames.

76. The method of claim 75, wherein the predetermined phase shift is 0°.

77. The method of claim 75, wherein the step of providing the predetermined phase shift comprises the step of providing a fixed phase shift between immediately adjacent frames in the plurality of frames.

78. The method of claim 73, further comprising the step of providing a reference clock frequency adapted to provide the first and second reference frequencies.

79. The method of claim 78, wherein the step of providing the first reference frequency comprises the step of dividing the reference clock frequency by a first divisor, and the step of providing the second reference frequency comprises the step of dividing the reference clock frequency by a second divisor that is greater than the first divisor.

* * * * *